(12) United States Patent
Kvam et al.

(10) Patent No.: US 11,156,666 B2
(45) Date of Patent: Oct. 26, 2021

(54) SYSTEM AND METHODS FOR FAULT DETECTION

(71) Applicant: Verdigris Technologies, Inc., Mountain View, CA (US)

(72) Inventors: Jacques Kvam, Mountain View, CA (US); Danny Serven, Mountain View, CA (US)

(73) Assignee: Verdigris Technologies, Inc., Mountain View, CA (US)

( * ) Notice: Subject to any disclaimer, the term of this patent is extended or adjusted under 35 U.S.C. 154(b) by 0 days.

(21) Appl. No.: 16/100,090

(22) Filed: Aug. 9, 2018

(65) Prior Publication Data
US 2020/0348363 A1 Nov. 5, 2020

Related U.S. Application Data

(60) Provisional application No. 62/543,165, filed on Aug. 9, 2017.

(51) Int. Cl.
*G01R 31/34* (2020.01)

(52) U.S. Cl.
CPC .................. *G01R 31/343* (2013.01)

(58) Field of Classification Search
CPC ..... G01R 31/343; G01R 31/34; G01R 31/346
See application file for complete search history.

(56) References Cited

U.S. PATENT DOCUMENTS

| | | | | |
|---|---|---|---|---|
| 4,965,513 A * | 10/1990 | Haynes | ................... | G01R 31/34 318/490 |
| 5,049,815 A * | 9/1991 | Kliman | ................ | G01R 31/346 324/545 |
| 5,345,158 A * | 9/1994 | Kliman | ................ | G01R 31/343 318/432 |
| 6,590,362 B2 * | 7/2003 | Parlos | ..................... | H02P 29/02 318/799 |
| 7,539,549 B1 * | 5/2009 | Discenzo | ............ | F04D 15/0077 324/765.01 |
| 9,453,869 B1 * | 9/2016 | Parkin | ................ | G01R 19/2513 |
| 2009/0109021 A1 * | 4/2009 | Paoletti | ................ | G01R 31/343 340/540 |
| 2010/0169030 A1 * | 7/2010 | Parlos | ..................... | G01H 1/00 702/58 |

(Continued)

*Primary Examiner* — Lee E Rodak
(74) *Attorney, Agent, or Firm* — Procopio, Cory, Hargreaves & Savitch LLP

(57) ABSTRACT

A system and system for motor fault detection are provided. The system includes a data collection sensor electrically coupled to a motor, and a processor functioning as a Motor Current Signature analyzer (MCSA) detecting performance conditions of the motor based on a measured power draw current data captured by the sensor and providing condition information indicative of a fault in the motor based on the detected performance conditions. The method includes measuring, by a data collection sensor, power draw current data from the motor, detecting, by a processor functioning as a Motor Current Signature analyzer (MCSA), performance conditions of the motor based on the measured power draw current data, and providing condition information indicative of a fault in the motor based on the detected performance conditions to a user.

14 Claims, 5 Drawing Sheets

(56) References Cited

U.S. PATENT DOCUMENTS

| | | | |
|---|---|---|---|
| 2010/0293397 A1* | 11/2010 | Pham | F04B 49/065 713/300 |
| 2014/0266755 A1* | 9/2014 | Arensmeier | G05B 15/02 340/679 |
| 2015/0260794 A1* | 9/2015 | Athikessavan | G01R 31/50 702/58 |

* cited by examiner

SYSTEM AND METHODS FOR FAULT DETECTION

CROSS-REFERENCE TO RELATED APPLICATIONS

This application claims benefit of priority from Provisional U.S. Patent application Ser. No. 62/543,165, filed Aug. 9, 2017, the contents of which are incorporated by reference.

BACKGROUND

Field

The present disclosure relates to fault detection, and more specifically, to systems and methods for fault detection using energy monitoring.

Related Art

Commercial buildings are typically filled with critical devices driven by electric motors, such as heating and air conditioning ventilation systems, elevators, pumping systems, etc. Electric motors are susceptible to various types of malfunctions that disrupt building occupants and operations. For example, electric motors include rotor bars with a rotating magnetic field which induces a voltage in the rotor bars as it passes over them. Motors are the key component to many types of machines. For example, building power systems may support three-phase induction motors that run compressors, fans, blowers, elevators, pumps, conveyor belts, turbines, etc.

Related art studies have shown that the average failure rate for time to first failure is about 3.13% for common three-phase induction motors. Different components of a motor have different likelihoods of failure. Given a faulty motor, this is the likelihood of failure for the primary components.

A motor fault does not necessarily mean the motor ceases to work. Motor faults may include inefficient performance or performance that indicate a component of the motor is close to complete failure.

SUMMARY

In example implementations, the energy monitors as described herein can automatically detect faults and abnormal performance of electric motors when connected to a power line or power system, thereby eliminating the need for independent monitoring of motors.

BRIEF DESCRIPTION OF DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
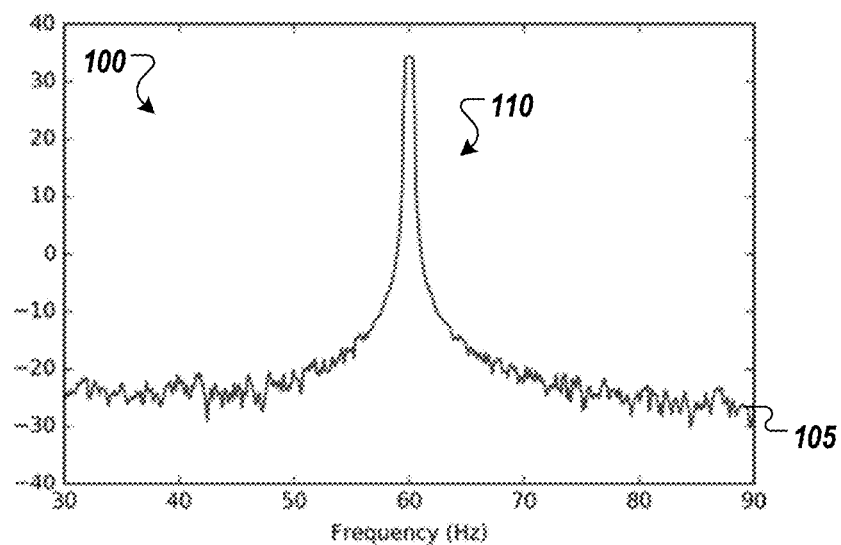
FIG. 1 illustrates an example fault detection analysis graph, in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination, and the functionality of the example implementations can be implemented through any means according to the desired implementations.

The monitoring of motor faults requires a high resolution spectrum to separate different frequency components. At light load condition, it is quite difficult to distinguish between healthy and faulty rotors because the characteristics of broken rotor bar fault frequencies are very close to fundamental component and their amplitudes are small in comparison. Related art systems are unable to detect a fault and classification of the fault severity under light loads.

A stator winding fault occurs when insulation fails that can create shorts within the stator winding. A rotor bar fault occurs due to fissions or cracking in the rotor bars that can cause the motor to overheat and completely break the rotor bar. In another example, bearing faults occur in electric motors when the bearings become pitted, causing micro shifts inside the internals of the motors. Traditionally, electric motor faults are diagnosed after the motor fails. In the related art, pre-emptive motor fault detection involves sophisticated sensitive sensors attached directly to each motor that gather large amounts of motor specific metrics.

Devices without internal diagnostics system typically require a specialized technician to physically inspect the device to verify a fault and troubleshoot to identify the type of fault or root cause. The information gathered by the sensors and analyzed by the maintenance diagnostic service can reduce the frequency and costs of service trips.

Methods and systems described herein include detection of eccentric loads that indicate a potential motor fault prior to motor failure, for example due to a cracked rotor or pitted ball bearing.

Figure 2:
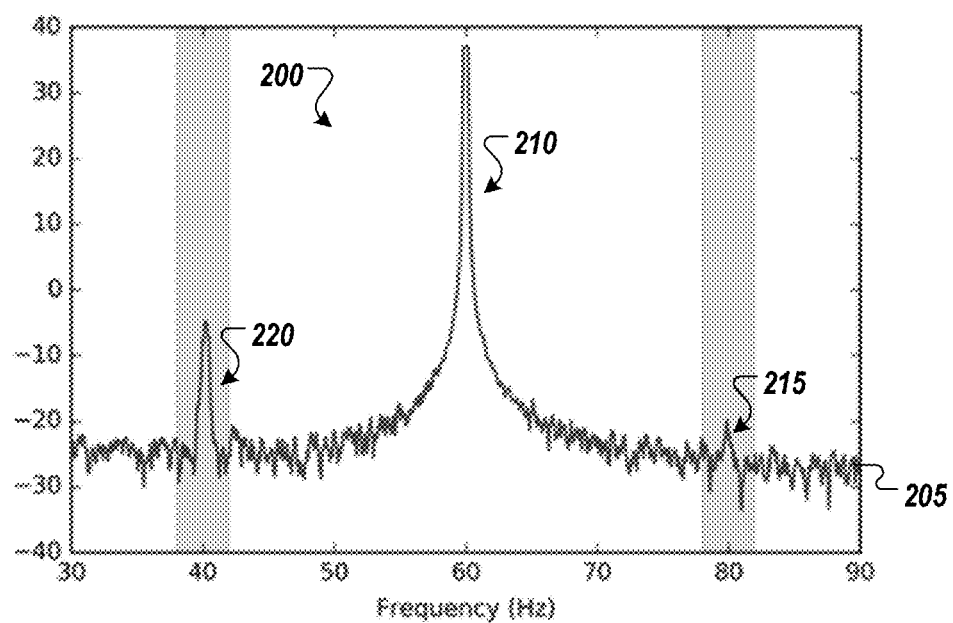
FIG. 2 illustrates an example fault detection analysis graph, in accordance with an example implementation.

FIGS. 1 and 2 illustrate part of the analysis graphs to detect broken rotor bars. FIG. 1 shows frequency spectrum 100 of the current from motor with no broken rotor bars. FIG. 2 shows frequency spectrum 200 of the current from motor with a broken rotor bar. The frequency spectrum signals of the current are viewed near the power supply frequency (in this case 60 Hz). In a healthy motor, the spectrum signal 105 is flat aside from the 60 Hz spike 110. In a motor with broken rotor bars, the spectrum signal 205 includes the spike 210 at the power supply frequency (60

Hz) but also includes spikes 215, 220 in energy at two frequencies on either side of 60 Hz which are caused by the broken rotor bars.

The specific frequencies are functions of the current state of the motor and motor parameters. The system includes a Motor Current Signature Analysis (MCSA) module for detecting and diagnosing device health. The MCSA may be implemented by a computing device, such as computing device 605 illustrated in FIG. 6 discussed below. In an example implementation, the MCSA analyzes high definition performance data of devices to identify faults. MCSA is used to detect faults using sensors located at a central point of a local power system with a high sampling rate. For example, the system identifies induction motor faults using only electrical data via MCSA, using only its electrical signature. The MCSA analysis compares one or more high resolution analyses of electrical frequency between a healthy motor and a motor with a broken rotor bar.

In an example implementation, load detection occurs at a central location of a local power system without motor-specific sensors. In an example implementation, sensors are attached to circuits at a breaker panel and power draw data is analyzed to identify separate device signatures from each motor attached to the circuit. In an example implementation, rotor bar faults are detected based on the power draw of a motor.

A data collector system can be coupled to the local power system to monitor aggregate power used at a location (e.g., commercial, industrial, or residential building). In an example implementation, circuit based sensors can collect power usage data at a central location, for example, a distribution board (e.g., panelboard, breaker panel, electric panel, etc.). For example, circuit based sensors can be used at an electric panel, where a single sensor is clamped onto each circuit, and the sensors are daisy-chained together, with a data transmitter to connect to a cloud analyzer system. Circuit based sensors can be used for super-high-frequency disaggregation (e.g., 8 kilohertz). In an example implementation, sensors are clipped onto circuit breakers, networked together and wired into an independent communication interface. Data from the sensors is streamed to cloud-based software for analysis that is coupled with weather and electricity pricing data from utilities or alternative energy resources (e.g., solar cells, on-site batteries, etc.). The system can alert building managers (e.g., users) when the facilities are using large amounts of electricity during high demand and identify devices to mitigate the demand, for example, adjusting heating and cooling systems based on current weather data, utility power pricing, building performance forecasts, etc.

Abnormal or inefficient performance of an electric motor is detectable even if the abnormality does not cause a fault or catastrophic malfunction. For example, the system can detect abnormal performance of a motor that gradually over time or sporadically consumes more power than required for normal operation. In some cases, overconsumption of power can cause components or casings to heat up. Non-catastrophic overheating increases building cooling costs and creates potential secondary dangers, such as harming maintenance staff or starting fires.

A short cycling detector uses an algorithm to detect appliances (e.g., HVAC, air conditioning, refrigerator, etc.) that experience set-point problems (e.g., clogged valves, mis-configurations, etc.). Short cycling malfunctions waste energy, reduce the lifetime of the appliance, and can cause catastrophic failure or secondary damage to buildings (e.g., flooding).

Figure 3A:
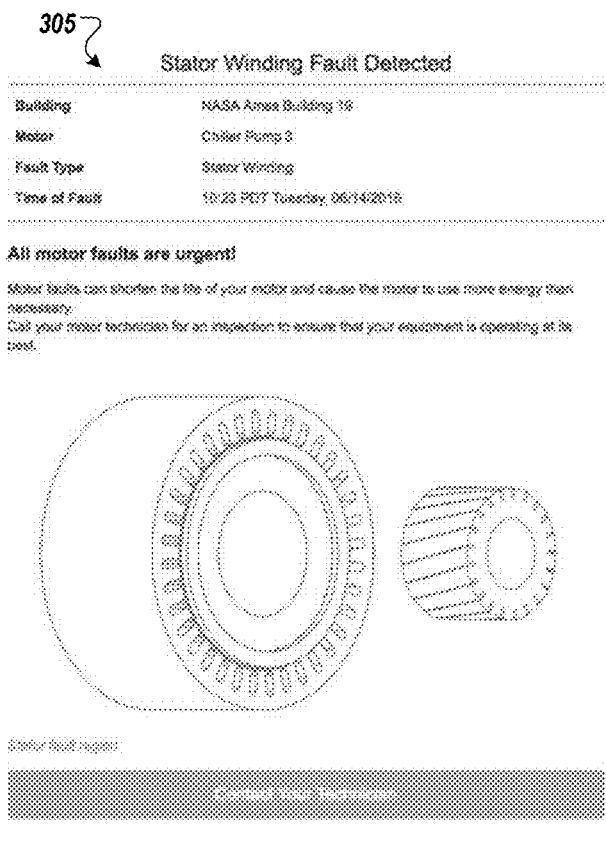
FIGS. 3A-B illustrate example fault alerts in accordance with example implementations.
Figure 3B:
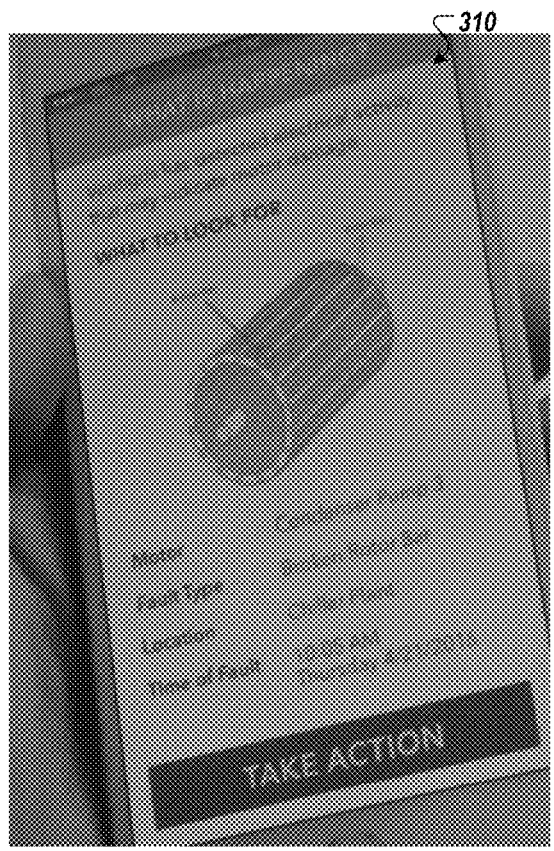

FIGS. 3A-B illustrate example fault alert User interfaces (UI) 305, 310 in accordance with example implementations. Motor fault reports can be integrated into a mobile application with high level weekly reports and detailed diagnostic reports. The UIs 305, 310 may be displayed on a display of a computing device, such as computing device 605 of FIG. 6 discussed below. The system continuously monitors the health of motors (e.g., 601) connected to a local power system (e.g., 604) using the sensors (e.g., 602). When a fault is detected, an alert is generated in a much shorter time frame than traditional building monitoring can.

Figure 4:
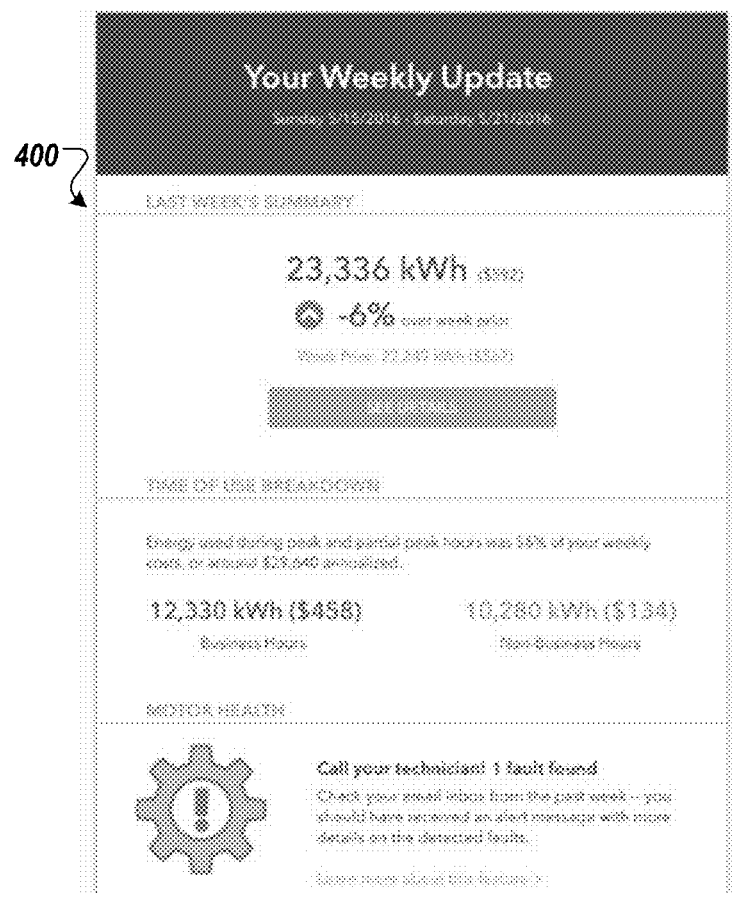
FIG. 4 illustrates an example system report in accordance with an example implementation.

FIG. 4 illustrates an example system report UI 400 in accordance with an example implementation. The UIs 305, 310 may be displayed on a display of a computing device, such as computing device 605 of FIG. 6 discussed below. Methods and systems described herein include a real-time alert system for abnormal device performance and critical system faults. An energy tracker notification platform includes the ability to notify facility managers and chief engineers about energy consumption problems in their building, in real time. Sensors collect a volume of high definition data for critical equipment of buildings.

Figure 5:
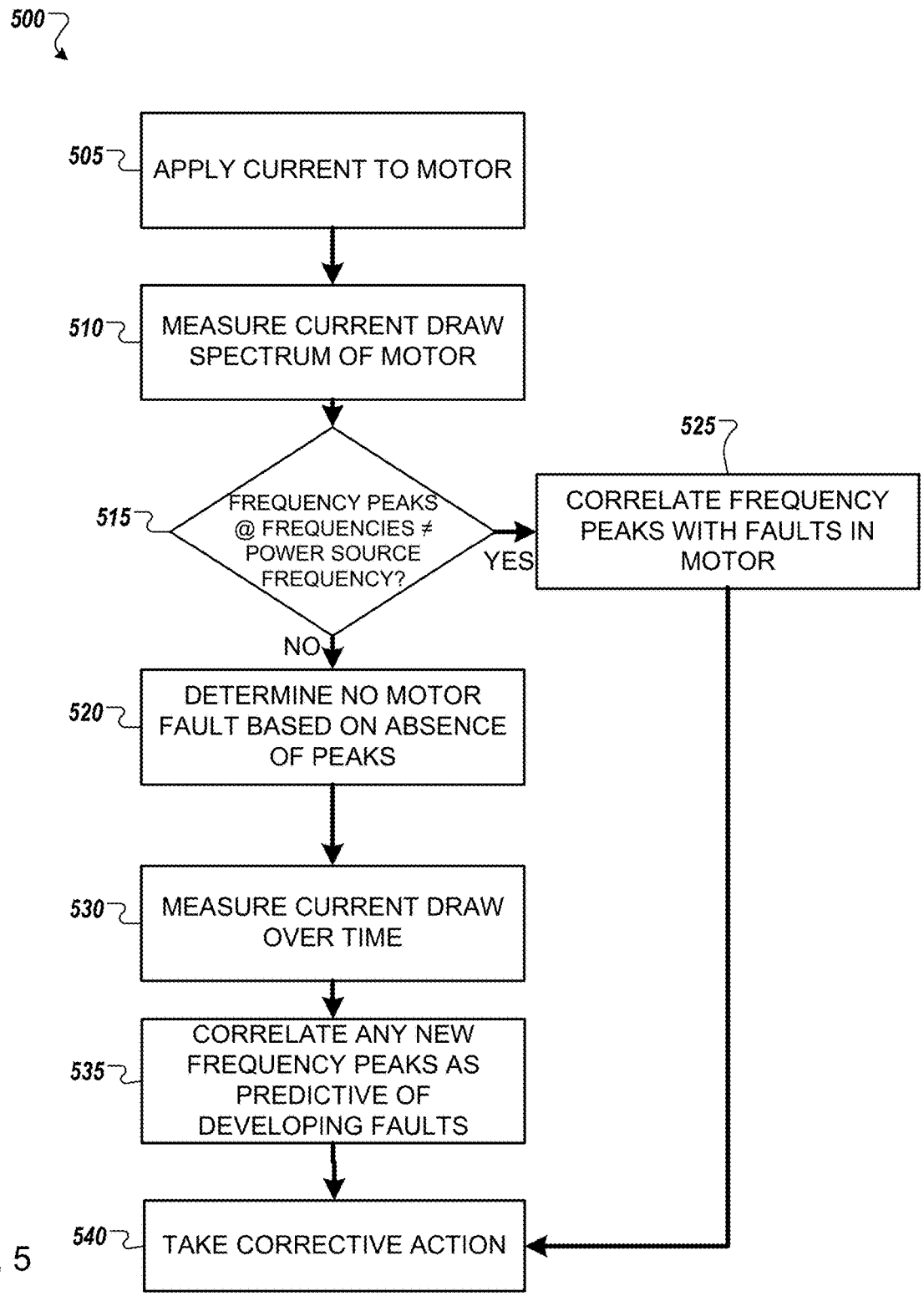
FIG. 5 illustrates a flow chart of a process of identifying and predicting potential motor faults in accordance with an example implementation.

FIG. 5 illustrates a flow chart 500 of a process of identifying and predicting potential motor faults in accordance with an example implementation. The method may be performed by a computing device, such as computing device 605 of FIG. 6 discussed below as part of the systems described herein.

As illustrated, a current is applied to the motor at 505 to cause the motor to rotate. As current is applied to the motor, the current draw spectrum of the motor is measured at 510. The current draw spectrum may be measured by a current sensor placed at a circuit breaker or control box connecting the motor to a power source. In other words, the current sensor may be remotely located from the motor. Additionally, the current sensor may be independent from the motor such that replacement of the sensor does not require access to the motor.

At 515, a determination is made whether the current spectrum measured by the current sensor shows any frequency peaks independent from the current frequency of the power source. If no frequency peaks independent from the current frequency of the power source are detected (NO at 515), the motor is determined to not have any faults currently at 520. The sensor may continue to measure a current draw spectrum of the motor over time at 530 and any new frequency peaks that may be detected over time are correlated as indicative of developing faults within the motor 535. If faults have developed, potential corrective action such as maintenance, repair or replacement may be taken at 540.

Conversely, returning to the determination of 515, if any frequency peaks independent from the current frequency of the power source are detected (YES at 515), the frequency peaks independent from the current frequency of the power source are correlated with motor faults at 525. If motor faults are detected, potential corrective action such as maintenance, repair or replacement may be taken at 540.

Thus, the system detects the electric motor performance based on the currents going through to the motor. In response to detecting a potential motor fault or abnormal performance, the system can alert a building operator to the location of the electric motor, provide detailed historical performance reports, forecast the likelihood of a catastrophic motor malfunction, a fault type, and a response strategy.

The response strategy can alert the building manager to take action, for example, place the device into a safe-mode, switch to a back-up device, and/or schedule a specialist to inspect and repair the device. To assist with diagnostic and repair of a device, the system provides the user (e.g., building manager) a detailed report with information including graphical depictions of the historical electric signal that can be forwarded to a repair vendor or specialist.

The detailed information collected by the system provides the repair vendor with diagnostic information that might not be otherwise available directly from the device or motor. Based on the history of how quickly the fault frequency develops, fault likelihood and lifetime performance hours can be used as a countdown to a fault or need for maintenance. In an example implementation, the report can include a severity rating relative to the other motors that are being monitored on that site or based on similarly tracked devices at other locations.

Further, when multiple devices of the same type are monitored, the performance of each common device can be analyzed relative to the other common devices to provide a health assessment and forecast or prioritize maintenance needs. The system can determine a predicted time to failure and include an estimated remaining life of the motor.

For example, the system monitoring a building with multiple elevator devices that each includes electric motors can track the performance of each motor that is compared to the other elevator devices and assess the likelihood of faults in the electric motors to improve pattern detection for faults and prioritize maintenance among the multiple elevator devices. In some example implementations, the system may build a statistical model using data from motors with similar characteristics, for example an induction motor with the same number of poles and slots, etc. For example, based on previously observed total faults, the system determines an estimate of the time until the developed fault becomes a total fault, for example, if part of a motor is slipping or beginning to crack. Accordingly, a building with a single elevator system can be compared to other similar elevator systems in order to provide comparative metrics.

The system collects detailed performance data to develop diagnostics (e.g., a phase of the motor that malfunctioned) that can be sent to an electrician, vendor, manufacturer, insurance company, etc. The system enables gathering performance metrics for electric motors in devices that are otherwise not connected with the need for independent real-time monitoring systems for each device. For example, the system providing the motor's RPM data and number of rotor bar slots can verify a fault occurred and reduce onsite diagnostic time by the repair vendor.

Additionally, device vendors can use the historical performance of the devices for future improvements or upgrades based on actual performance data without each device vendor having to support independent real-time monitoring systems. For example, fault frequencies can be tracked with the device performance data, rather than being tracked independently by a vendor's repair visit database.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Figure 6:
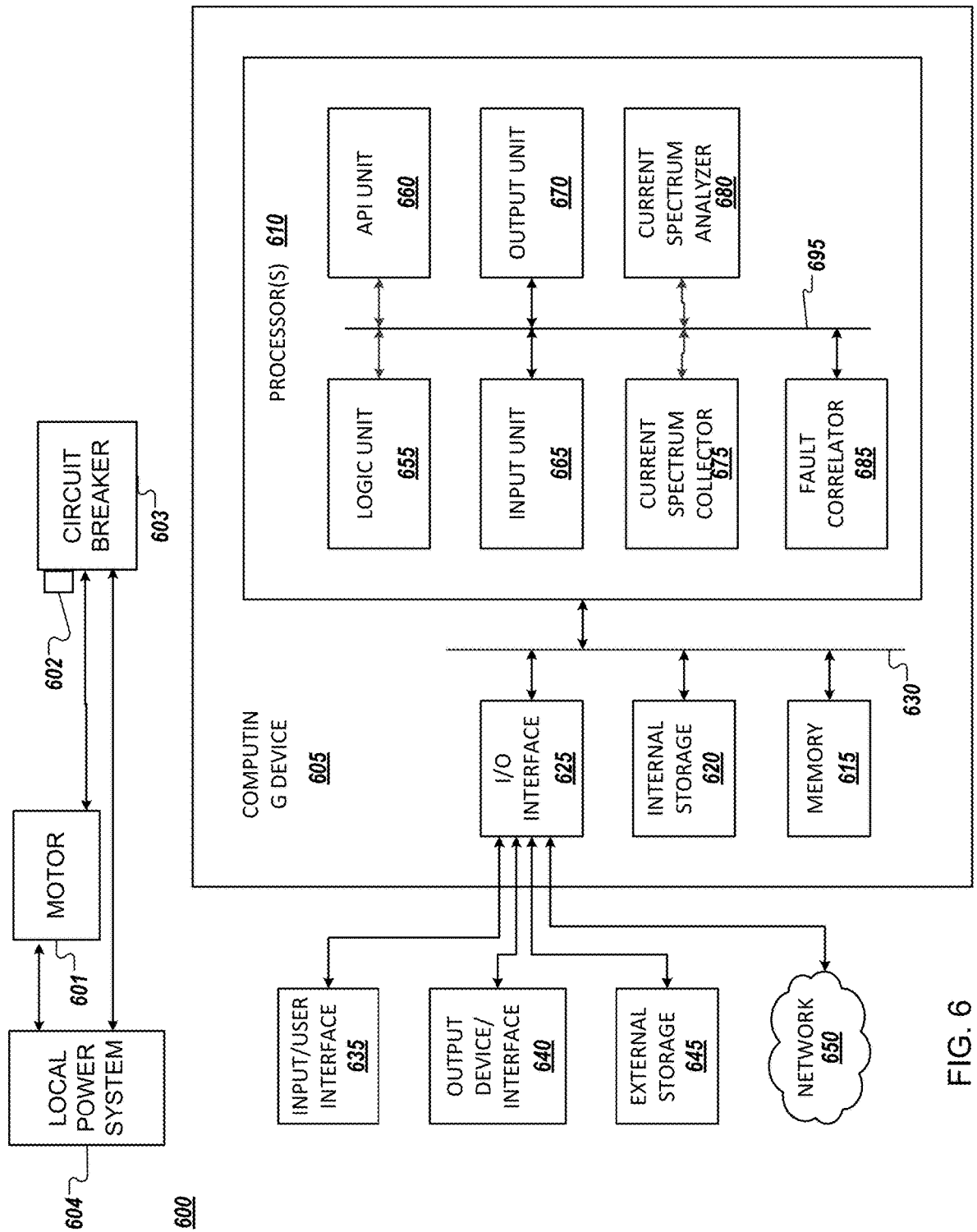
FIG. 6 illustrates an example computing environment with an example computing device suitable for use in some example implementations of the present application.

FIG. 6 illustrates an example computing environment 600 with an example computing device 605 suitable for use in some example implementations. Computing device 605 in computing environment 600 can include one or more processing units, cores, or processors 610, memory 615 (e.g., RAM, ROM, and/or the like), internal storage 620 (e.g., magnetic, optical, solid state storage, and/or organic), and/or I/O interface 625, any of which can be coupled on a communication mechanism or bus 630 for communicating information or embedded in the computing device 605.

Computing device 605 can be communicatively coupled to input/interface 635 and output device/interface 640. Either one or both of input/interface 635 and output device/interface 640 can be a wired or wireless interface and can be detachable. Input/interface 635 may include any device, component, sensor, or interface, physical or virtual, which can be used to provide input (e.g., buttons, touch-screen interface, keyboard, a pointing/cursor control, microphone, camera, braille, motion sensor, optical reader, and/or the like).

Output device/interface 640 may include a display, television, monitor, printer, speaker, braille, or the like. In some example implementations, input/interface 635 (e.g., user interface) and output device/interface 640 can be embedded with, or physically coupled to, the computing device 605. In other example implementations, other computing devices may function as, or provide the functions of, an input/interface 635 and output device/interface 640 for a computing device 605. These elements may include, but are not limited to, well-known AR hardware inputs so as to permit a user to interact with an AR environment.

Examples of computing device 605 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, server devices, other computers, information kiosks, televisions with one or more processors embedded therein and/or coupled thereto, radios, and the like).

Computing device 605 can be communicatively coupled (e.g., via I/O interface 625) to external storage 645 and network 650 for communicating with any number of networked components, devices, and systems, including one or more computing devices of the same or different configuration. Computing device 605 or any connected computing device can be functioning as, providing services of, or referred to as a server, client, thin server, general machine, special-purpose machine, or another label.

I/O interface 625 can include, but is not limited to, wired and/or wireless interfaces using any communication or I/O protocols or standards (e.g., Ethernet, 802.11xs, Universal System Bus, WiMAX, modem, a cellular network protocol, and the like) for communicating information to and/or from at least all the connected components, devices, and networks in computing environment 600. Network 650 can be any network or combination of networks (e.g., the Internet, local area network, wide area network, a telephonic network, a cellular network, satellite network, and the like).

Computing device 605 can use and/or communicate using computer-usable or computer-readable media, including transitory media and non-transitory media. Transitory media includes transmission media (e.g., metal cables, fiber optics), signals, carrier waves, and the like. Non-transitory media includes magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computing device 605 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C#, Java, Visual Basic, Python, Perl, JavaScript, and others).

Processor(s) 610 can execute under any operating system (OS) (not shown), in a native or virtual environment. One or more applications can be deployed that include logic unit 655, application programming interface (API) unit 660, input unit 665, output unit 670, current spectrum collector unit 675, current spectrum analyzer unit 680 and fault correlator unit 685, and inter-unit communication mechanism 695 for the different units to communicate with each other, with the OS, and with other applications (not shown).

For example, current spectrum collector unit 675, current spectrum analyzer unit 680 and fault correlator unit 685 may implement one or more processes shown in FIG. 5 and provide one or more UIs illustrated in FIGS. 1-4. The described units and elements can be varied in design, function, configuration, or implementation and are not limited to the descriptions provided.

In some example implementations, when information or an execution instruction is received by API unit 660, it may be communicated to one or more other units (e.g., current spectrum collector unit 675, current spectrum analyzer unit 680 and fault correlator unit 685). For example, the current spectrum collector unit 675 may collect current data associated with one or more motors from current sensors associated with the power supplied to the motor and provide the collected data to the current spectrum analyzer. Further, the current spectrum analyzer unit 680 may analyze the data from the current spectrum collector unit 675 to identify frequency peaks that are independent of the drive frequency of the power source and provide the identified peaks to the fault correlator unit 685. Further, the fault correlator unit 685 may identify motor faults based on the identified peaks and generate a UI identifying the fault and provide response options to a user via an output unit.

As disclosed above, in the local power system 604, a data collection sensor 602 (e.g., one of the data collection sensors in a data collector) is coupled to a motor 601 via the local power system 604. A circuit breaker 603, where the data collection sensor 602 may be physically attached to perform the monitoring, may be electrically coupled with the motor 601 via the local power system 604.

In some instances, the logic unit 655 may be configured to control the information flow among the units and direct the services provided by API unit 660, input unit 665, current spectrum collector unit 675, current spectrum analyzer unit 680 and fault correlator unit 685 in some example implementations described above. For example, the flow of one or more processes or implementations may be controlled by logic unit 655 alone or in conjunction with API unit 660.

Although a few example implementations have been shown and described, these example implementations are provided to convey the subject matter described herein to people who are familiar with this field. It should be understood that the subject matter described herein may be implemented in various forms without being limited to the described example implementations. The subject matter described herein can be practiced without those specifically defined or described matters or with other or different elements or matters not described. It will be appreciated by those familiar with this field that changes may be made in these example implementations without departing from the subject matter described herein as defined in the appended claims and their equivalents.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to, optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It can be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application may be apparent to those skilled in the art, from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

We claim:

1. A system, comprising:
   one or more data collection sensors indirectly electrically coupled to a plurality of motors, wherein none of the one or more data collection sensors is a motor-specific sensor, and no motor-specific sensor is present in the system, and wherein each of the one or more data collection sensors is directly attached to a circuit breaker associated with at least one of the plurality of motors; and
   at least one processor configured to
   function as a Motor Current Signature analyzer (MCSA) to detect performance conditions of the plurality of motors based only on a measured power draw current data captured by the one or more data collection sensors, and provide condition information indicative of a fault in the at least one motor based on the detected performance conditions of the at least one motor,
   build a statistical model using the measured power draw current data for at least a subset of the plurality of motors having similar characteristics to the at least one motor, and,
   when the condition information indicates a fault in the at least one motor, estimate a time until the fault becomes a total fault based on the statistical model,
   wherein the one or more data collection sensors are part of a data collector coupled to a local power system associated with the plurality of motors to monitor aggregate power used at a location,
   wherein the data collector is configured to collect super-high-frequency current samples over a sufficient time period so as to be used for a current draw spectrum measured by the data collector that provides frequency peaks that are separated by tens of hertz and are independent from a current frequency of the local power system,
   wherein in a healthy motor, the spectrum signal is flat aside from the frequency peaks being 60 Hz, and
   wherein in a motor with broken rotor bars, the spectrum signal includes the frequency peaks at 60 Hz and spikes in energy at frequencies on either side of each of the frequency peaks at 60 Hz, which are caused by the broken rotor bars.

2. The system of claim 1, wherein each of the one or more data collection sensors is independently positioned from a respective motor of the plurality of motors, such that each data collection sensor can be replaced without accessing the respective motor.

3. The system of claim 2, wherein the one or more data collection sensors are a plurality of circuit based sensors configured to collect power usage data at a central location.

4. The system of claim 3, wherein each of the plurality of circuit based sensors is clipped onto a corresponding circuit breaker that is associated with a respective motor of the plurality of motors, and wherein the plurality of circuit based sensors are networked together and wired into an independent communication interface to communicate with the at least one processor.

5. The system of claim 2, wherein the at least one processor collects the measured power draw current data for the at least a subset of motors having similar characteristics over an extended period of time to build the statistical model, and wherein the similar characteristics comprise a same number of poles and slots as the at least one motor.

6. The system of claim 5, wherein the at least one processor executes an algorithm to detect a set-point problem in an appliance based on detected changes in the measured power current draw data.

7. A method of detecting a fault in a motor, the method comprising:
   by one or more data collection sensors indirectly electrically coupled to a plurality of motors, measuring power draw current data from each of the plurality of motors, wherein none of the one or more data collection sensors is a motor-specific sensor, and wherein each of the one or more data collection sensors is directly attached to a circuit breaker associated with at least one of the plurality of motors; and,
   by at least one processor,
   functioning as a Motor Current Signature analyzer (MCSA) to detect performance conditions of the plurality of motors based only on the measured power draw current data, and provide condition information indicative of a fault in the at least one motor based on the detected performance conditions of the at least one motor,
   building a statistical model using the measured power draw current data for at least a subset of the plurality of motors having similar characteristics to the at least one motor, and,
   when the condition information indicates a fault in the at least one motor, estimate a time until the fault becomes a total fault based on the statistical model,
   wherein the one or more data collection sensors are part of a data collector coupled to a local power system associated with the plurality of motors to monitor aggregate power used at a location,
   wherein the data collector is configured to collect super-high-frequency current samples over a sufficient time period so as to be used for a current draw spectrum measured by the data collector that provides frequency peaks that are separated by tens of hertz and are independent from a current frequency of the local power system,
   wherein in a healthy motor, the spectrum signal is flat aside from the frequency peaks being 60 Hz, and
   wherein in a motor with broken rotor bars, the spectrum signal includes the frequency peaks at 60 Hz and spikes in energy at frequencies on either side of each of the frequency peaks at 60 Hz, which are caused by the broken rotor bars.

8. The method of claim 7, wherein the one or more data collection sensors are a plurality of circuit based sensors configured to collect power usage data at a central location.

9. The method of claim 8, wherein each of the plurality of circuit based sensors is clipped onto a corresponding circuit breaker that is associated with a respective motor of the plurality of motors, and wherein the plurality of circuit based sensors are networked together and wired into an independent communication interface to communicate with the at least one processor.

10. The method of claim 8, further comprising, by the at least one processor, collecting the measured power draw current data for the at least a subset of motors having similar characteristics over an extended period of time to build the statistical model, wherein the similar characteristics comprise a same number of poles and slots as the at least one motor.

11. The method of claim 10, further comprising, by the at least one processor, executing an algorithm to detect set-point problems in an appliance based on detected changes in the measured power current draw data.

12. A non-transitory computer readable medium encoded with instructions for controlling a computer to:
- from one or more data collection sensors indirectly electrically coupled to a plurality of motors, receive power draw current data measured from each of the plurality of motors, wherein none of the one or more data collection sensors is a motor-specific sensor, and wherein each of the one or more data collection sensors is directly attached to a circuit breaker associated with at least one of the plurality of motors;
- detect performance conditions of the plurality of motors based only on the measured power draw current data;
- provide condition information indicative of a fault in the at least one motor based on the detected performance conditions of the at least one motor;
- build a statistical model using the measured power draw current data for at least a subset of the plurality of motors having similar characteristics to the at least one motor; and,
- when the condition information indicates a fault in the at least one motor, estimate a time until the fault becomes a total fault based on the statistical model,
- wherein the one or more data collection sensors are part of a data collector coupled to a local power system associated with the plurality of motors to monitor aggregate power used at a location,
- wherein each of the one or more data collection sensors is independently positioned from a respective motor of the plurality of motors, such that the data collection sensor can be replaced without accessing the respective motor,
- wherein the data collector is configured to collect super-high-frequency current samples over a sufficient time period so as to be used for a current draw spectrum measured by the data collector that provides frequency peaks that are separated by tens of hertz and are independent from a current frequency of the local power system,
- wherein in a healthy motor, the spectrum signal is flat aside from the frequency peaks being 60 Hz,
- wherein in a motor with broken rotor bars, the spectrum signal includes the frequency peaks at 60 Hz and spikes in energy at frequencies on either side of each of the frequency peaks at 60 Hz, which are caused by the broken rotor bars, and
- wherein the one or more data collection sensors are a plurality of circuit based sensors configured to collect power usage data at a central location.

13. The non-transitory computer readable medium of claim 12, wherein each of the plurality of circuit based sensors is clipped onto a corresponding circuit breaker that is associated with a respective motor of the plurality of motors, and wherein the plurality of circuit based sensors are networked together and wired into an independent communication interface to communicate with the computer.

14. The non-transitory computer readable medium of claim 12, wherein the instructions control the computer to:
- collect the measured power draw current data for the at least a subset of motors having similar characteristics over an extended period of time to build the statistical model; and
- detect set-point problems in an appliance based on detected changes in the measured power current draw data.

* * * * *